United States Patent
Watanabe et al.

(10) Patent No.: US 6,351,284 B1
(45) Date of Patent: *Feb. 26, 2002

(54) METHOD AND APPARATUS FOR DRIVING SOLID STATE IMAGE SENSOR

(75) Inventors: Tohru Watanabe, Ogaki; Shuichi Nakano, Hashima, both of (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/719,439

(22) Filed: Sep. 25, 1996

(30) Foreign Application Priority Data

Sep. 29, 1995 (JP) .............................. 7-253886

(51) Int. Cl.[7] .............................................. H04N 5/335
(52) U.S. Cl. ........................ 348/312; 348/314; 348/250
(58) Field of Search ................................ 348/312, 311, 348/322, 313, 314, 315, 294, 297, 298, 299, 241, 248, 249, 250; 257/229, 230; H04N 5/335

(56) References Cited

U.S. PATENT DOCUMENTS

| | | | | |
|---|---|---|---|---|
| 4,736,261 A | * | 4/1988 | Nutting | 348/322 |
| 4,851,915 A | * | 7/1989 | Yang et al. | 358/213.19 |
| 4,875,100 A | * | 10/1989 | Yonemoto et al. | 348/296 |
| 4,916,501 A | * | 4/1990 | Thenoz et al. | 257/230 |
| 5,144,445 A | * | 9/1992 | Higashitsutsumi | 348/311 |
| 5,270,558 A | * | 12/1993 | Reich et al. | 257/223 |
| 5,285,091 A | * | 2/1994 | Hamasaki | 257/230 |

* cited by examiner

Primary Examiner—Tuan Ho
(74) Attorney, Agent, or Firm—Sheridan Ross P.C.

(57) ABSTRACT

A method and apparatus for driving a solid state image sensor are disclosed. The method and apparatus operate such that the amount of information charges remaining in channel regions at the time of transferring the information charge packets from the channel regions is significantly reduced. The solid state image sensor being driven has a semiconductor substrate, at least one layer of which is located over the semiconductor substrate and where channel regions are formed, and gate electrodes are formed over the semiconductor substrate to respectively cover the channel regions. Drain regions are also defined in the semiconductor substrate respectively adjacent to the channel regions in either a lateral direction or a vertical direction. Each channel region is capable of storing information charges. The driving device for the described solid state image sensor includes: a first control voltage generator for applying a first control voltage to one of the gate electrodes in a predetermined period to form a potential well in at least one of the channel regions; and a second control voltage generator for applying a second control voltage to the semiconductor substrate defining the drain regions in the predetermined period so as to set the potential barrier lower than the preset height in order to temporarily restrict an amount of the information charges to be stored in the potential well.

6 Claims, 6 Drawing Sheets

METHOD AND APPARATUS FOR DRIVING SOLID STATE IMAGE SENSOR

BACKGROUND OF THE INVENTION

1. Field of the Invention

The present invention relates to a method and apparatus for driving a solid state image sensor, and, more particularly to a method and apparatus for transfering charge pakets in a solid state image sensor having a semiconductor substrate and a plurality of channel regions provided on the semiconductor substrate.

2. Description of the Related Art

An image sensing apparatus, which has a solid state image sensor like a CCD (Charge Coupled Device), controls the exposure of the solid state image sensor to acquire the optimal exposure state. This exposure control uses a iris mechanism which mechanically controls the amount of incident light to the solid state image sensor in accordance with the luminance of light reflected from a target object to be sensed. Alternatively, the exposure control can use a so-called electronic shutter which controls the period the solid state image sensor accumlates charges in accordance with the luminance of light reflected from a target object.

The solid state image sensor has light-receiving pixels (elements) arranged in a matrix form, which stores (accumlates) information charges that are generated in accordance with the incident light. When an overflow of information charges occurs at some of the light-receiving pixels, excess charges leak from such light-receiving pixels and the leaking charges tend to bloom with information charges stored in the light-receiving pixels that are adjacent or peripherally located thereto. To prevent such blooming, an overflow drain is provided adjacent to each light-receiving pixel.

Figure 1:
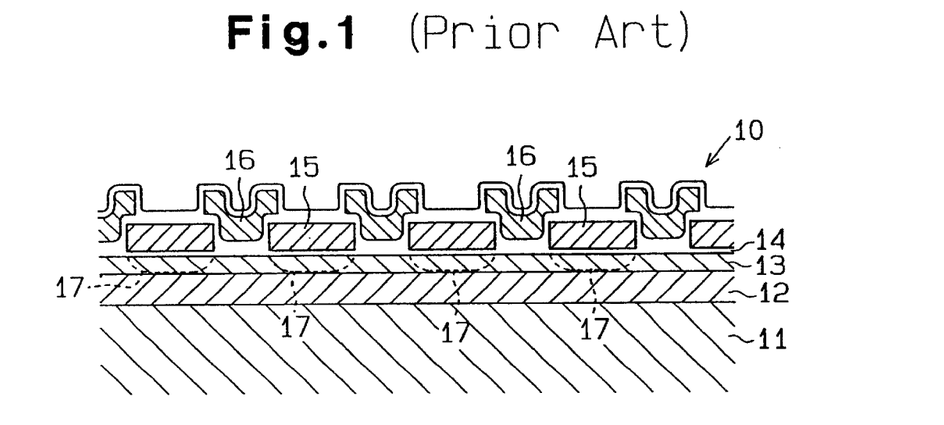
FIG. 1 is a cross-sectional view showing a light-receiving section of a conventional solid state image sensor having a vertical overflow drain structure.

FIG. 1 is a cross-sectional view of a light-receiving section 10 of a CCD solid state image sensor which employs a vertical overflow drain structure to absorb excess information charges on the substrate side. A diffusion region (P-well region) 12 having a P type conductivity is formed on the surface region of a semiconductor substrate 11 which has an N type conductivity and where a drain region is to be formed. Formed on the surface of this P-well region 12 is a diffusion layer (buried layer) 13 which has an N type conductivity and where a channel region 17 is to be formed. This buried layer 13 is so formed as to be defined by an isolation region (not shown) on the surface of the P-well region 12 and to extend in one direction. First gate electrodes 15 are arranged at given intervals on the buried layer 13 via an insulating layer 14, and second gate electrodes 16 are arranged between the adjoining first gate electrodes 15 in such a way as to partially cover the individual gate electrodes 15.

Figure 2:
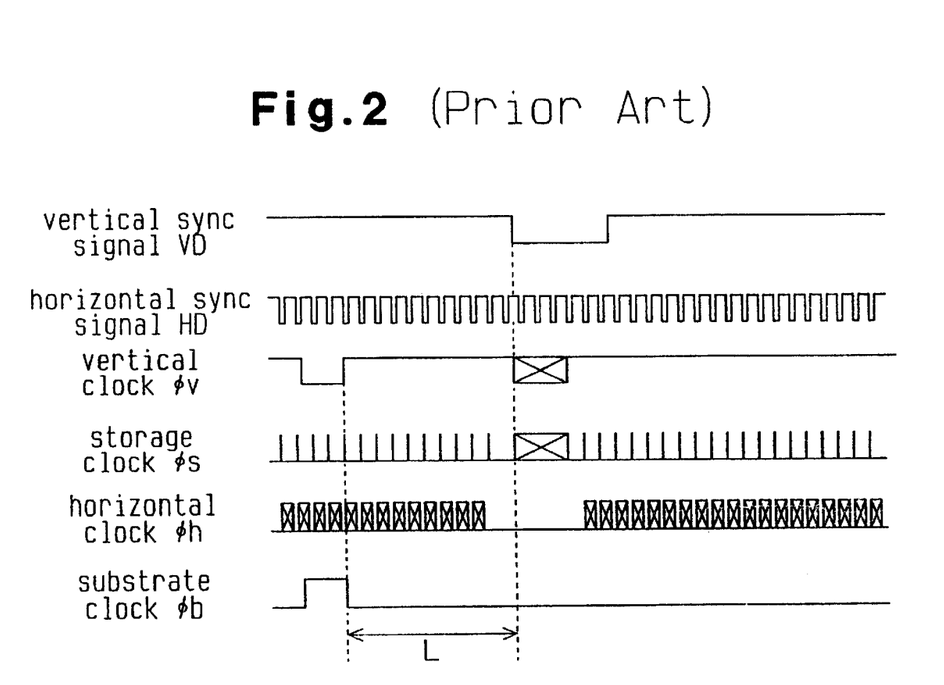
FIG. 2 is a timing chart for explaining the operation of the conventional image sensing apparatus shown in FIG. 1.

As shown in FIG. 2, the first and second gate electrodes 15 and 16 are respectively supplied with four-phase vertical clocks φv, each of which has a phase difference of 90 degrees from one to another and are synchronous with a vertical sync signal VD, and the semiconductor substrate 11 is supplied with a substrate clock φb. A ground voltage is applied to the P-well region 12. In response to the vertical clock φv, the light-receiving section 10 quickly transfers the information charges in the unit of packet to a storage section (not shown) included in the CCD solid state image sensor during the blanking period for vertical scanning. In response to the substrate clock φb, the light-receiving section 10 discharges the stored information charges. Therefore, the information-charge storing period of the light-receiving section 10 is indicated by a period L from the point of completion of the discharging of the information charge packets by the substrate clock φb to the beginning of the transfer of the information charge packets by the vertical clock φv. Alteration of the supply timing for this substrate clock φb permits the information-charge storing period or the shutter speed to be controlled.

In the vertical overflow drain structure, at the time the light-receiving section 10 stores information charges, the substrate clock φb is held at the low level, and one, two or three of the four-phase vertical clocks φv are kept at the high level and the remaining of clocks is kept at low level. As a result, the first and second gate electrodes 15 and 16 are selectively enabled. In a part of the light-receiving section 10 where the first and second gate electrodes 15 and 16 are enabled, as shown in FIG. 2, a potential well (depletion layer) is formed in the channel region 17 in the buried layer 13 and a potential barrier is formed in the P-well region 12. Accordingly, information charges are stored in the space from within the buried layer 13 to the surface of the P-well region 12. In another part of the light-receiving section 10 where the first and second gate electrodes 15 and 16 are disabled, a potential well is not formed in the buried layer 13 but a potential barrier for defining the light-receiving pixels is formed therein.

Figure 3:
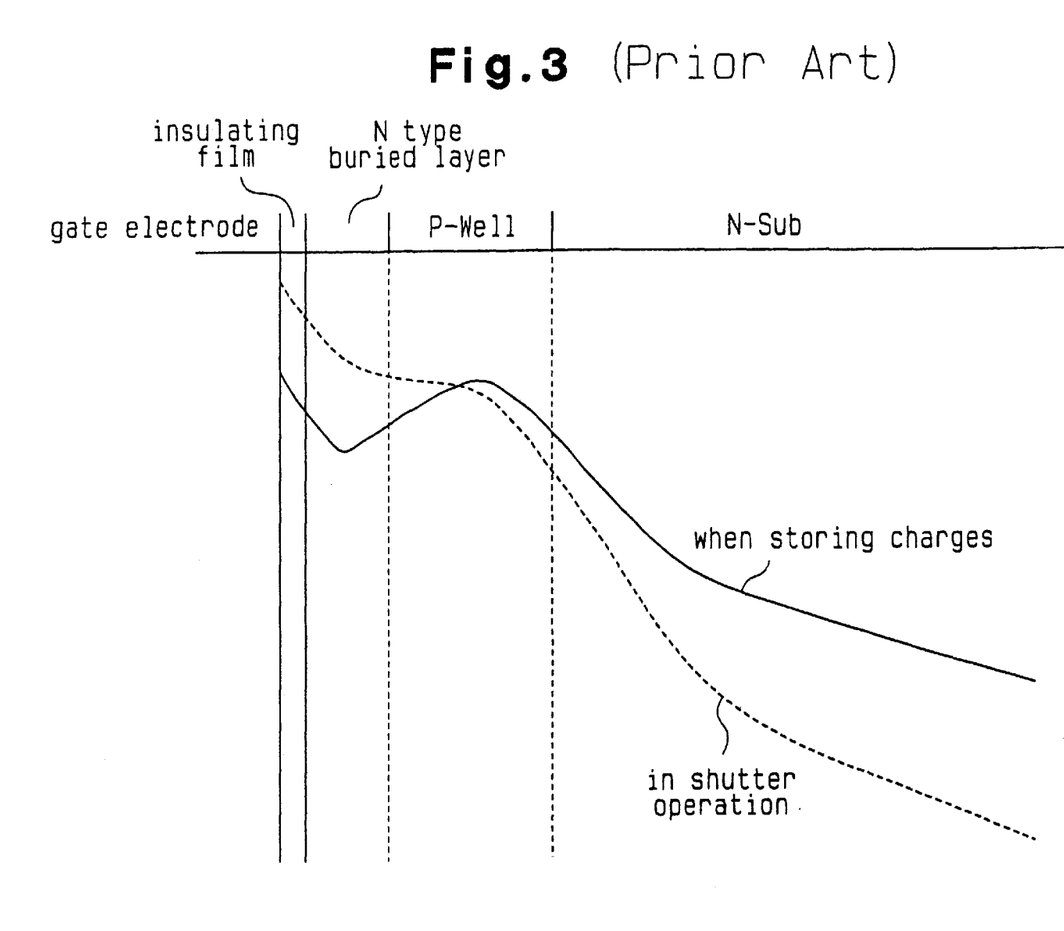
FIG. 3 is a diagram showing a potential change in the conventional solid state image sensor having the vertical overflow drain structure at the time of storing charges and in the shutter operation.

In the shutter operation for simultaneously discharging information charges stored in the individual light-receiving pixels, all the vertical clocks φv are kept at the low level and the substrate clock φb rises. Consequently, the potential well in the buried layer 13 becomes shallower while the potential well in the semiconductor substrate 11 becomes deeper. As a result, the potential barrier in the P-well region 12 disappears as indicated by the broken line in FIG. 3. In this manner, the information charges stored in the potential well in the buried layer 13 are moved to the semiconductor substrate 11 from the buried layer 13 along the potential profile and are discharged therefrom.

At the time of sensing an image, information charges are stored in the same channel regions 17 in the buried layer 13. At the time of reading the information charges, the information charge packets are transferred from those channel regions 17. At this time, the charge storing performance at the image sensing time differs from the charge transfer performance at the reading time. More specifically, at the image sensing time, a given voltage is applied to the first and second gate electrodes 15 and 16 to thereby fix the potential in the buried layer 13. The information charges are therefore stored in the channel regions 17 in the buried layer 13 without being affected by a delay in the potential variation.

At the reading time, however, a clock having a high frequency is supplied to the first and second gate electrodes 15 and 16 so that the potential alternatively varies. Even if the delay in the potential variation is generated and the same voltage as the one applied at the image sensing time is applied to the gates, the same amount of information charges as that produced at the image sensing time cannot be accumulated in the channel regions 17. In other words, the charge transfer performance at the reading time becomes smaller than the charge storing performance at the image sensing time. If the maximum amount of information charges allowed by the performance are stored in the channel regions 17 at the image sensing time, therefore, some of the charges will remain untransferred in the channel regions 17 after the reading time. For example, when bright spot light from a part of a target object is incident, some of the charges will remain untransferred in the channel regions 17. The remaining charges are added to those information charges which are stored in the subsequent light-receiving pixels at the time charge packets are transferred along the buried layer 13. This undesirable effect results in the deterioration of the quality of reproduced images.

SUMMARY OF THE INVENTION

Broadly speaking, the present invention relates to a method and apparatus for driving a solid state image sensor such that the amount of information charges remaining in the channel regions at the time of transferring the information charges stored in the channel regions is significantly reduced.

The invention can be implemented in numerous ways, including as a method and an apparatus. Several embodiments of the invention as described below.

As a method of driving a solid state image sensor having a semiconductor substrate and at least one layer which is located over the semiconductor substrate and where a plurality of channel regions are to be formed, a plurality of gate electrodes formed over said semiconductor substrate to respectively cover said channel regions, a plurality of drain regions being defined in the semiconductor substrate respectively adjacent to the plurality of channel regions in either a lateral direction or a vertical direction, each channel region being capable of storing information charges, an embodiment of the invention includes the operations of: forming a potential well in at least one of the plurality of channel regions; forming a potential barrier having a preset height between the one of the plurality of channel regions and an associated one of the plurality of drain regions; storing information charges, produced in the one of the plurality of channel regions, in the potential well in a predetermined period; deforming the potential barrier to set the potential barrier lower than the preset height in the predetermined period in order to temporarily restrict an amount of the information charges to be stored in the potential well; reforming the potential barrier so as to have substantially the same height as the preset height; and transferring packets of the information charges stored in the potential well to adjoining channel regions after the predetermined period elapses. Preferably, the deforming of the potential barrier step deforms the potential barrier to be lower than the preset height for a portion of the predetermined period at the end of the predetermined period.

As a driving device for a solid state image sensor adapted to an image sensing apparatus, the solid state image sensor having a semiconductor substrate, at least one layer which is located over the semiconductor substrate and where a plurality of channel regions are to be formed, and a plurality of gate electrodes formed over the semiconductor substrate to respectively cover the channel regions, a plurality of drain regions being defined in the semiconductor substrate respectively adjacent to the plurality of channel regions, each channel region being capable of storing information charges, an embodiment of the invention includes: a first control voltage generator for applying a first control voltage to one of the plurality of gate electrodes in a predetermined period to form a potential well in at least one of the plurality of channel regions, and to form a potential barrier having a preset height between the one of the plurality of channel regions and an associated one of the plurality of drain regions, whereby information charges produced in the one of the plurality of channel regions are stored in the potential well; and a second control voltage generator for applying a second control voltage to the semiconductor substrate defining the drain regions in the predetermined period so as to set the potential barrier lower than the preset height in order to temporarily restrict an amount of the information charges to be stored in the potential well, wherein the second control voltage generator applies a third control voltage to the semiconductor substrate following application of the second control voltage so that the potential barrier having a substantially same height as the preset height is reformed.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings, in which.

DETAILED DESCRIPTION OF THE PREFERRED EMBODIMENTS

Figure 4:
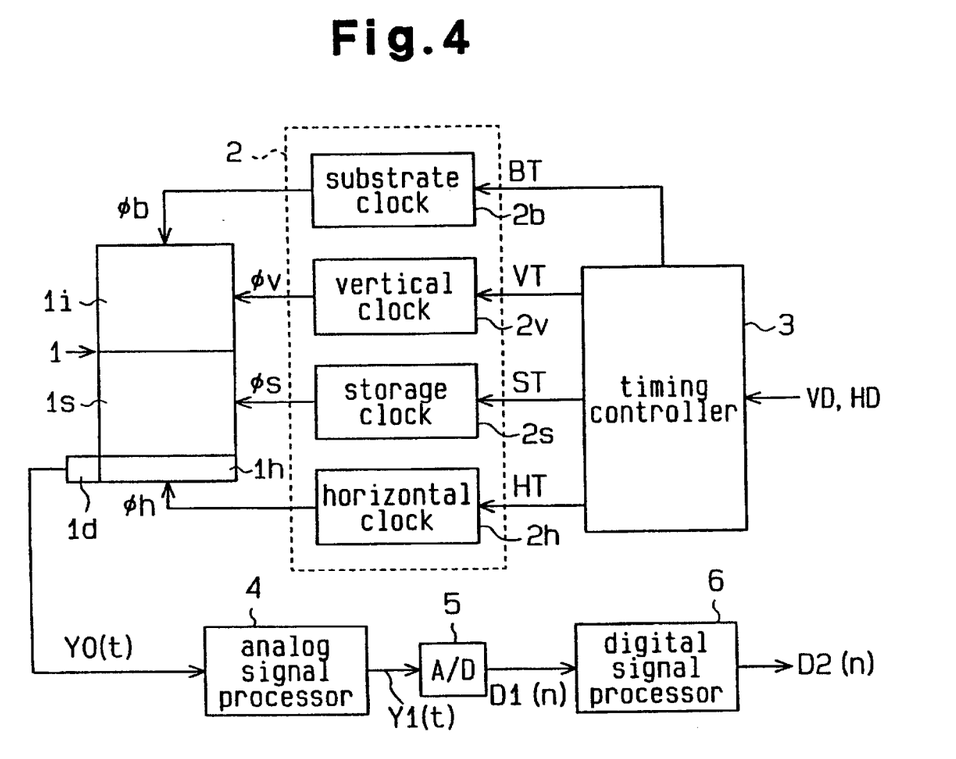
FIG. 4 is a block diagram showing an image sensing apparatus that uses a solid state image sensor employing a frame transfer system according to one embodiment of the invention.

Embodiments of the present invention will now be described referring to the accompanying drawings. According to one embodiment, the invention is adapted to an image sensing apparatus which is equipped with a solid state image sensor as shown in FIG. 4. As shown in FIG. 4, the image sensing apparatus comprises a CCD solid state image sensor 1, a clock generator 2, a timing controller 3, an analog signal processor 4, an A/D converter 5, and a digital signal processor 6.

The CCD solid state image sensor 1 includes a light-receiving section 1*i*, a storage section 1*s*, a horizontal transfer section 1*h* and an output section 1*d*. The light-receiving section 1*i* is constituted of a plurality of shift registers which are arranged in parallel in the horizontal direction and are arranged in series in the vertical direction. The individual bit of those shift registers form a light-receiving pixel which stores (accumulates) information charges that are produced in accordance with the light reflected from a target object to be sensed. The storage section 1*s* is constituted of a plurality of shift registers arranged in series to the associated shift registers of the light-receiving section 1*i*. The number of bits of each shift register in the storage section 1*s* is set so as to match with the number of bits of each shift register in the light-receiving section 1*i*. The storage section is temporarily stores one screen of information charge packets transferred from the light-receiving section 1*i* in this manner.

The horizontal transfer section 1*h* is comprised of a single shift register which has a plurality of bit respectively connected to the outputs of a plurality of the shift registers of the storage section 1*s*. The horizontal transfer section 1*h* receives one screen of information charge packets from the storage section 1*s* row by row, and sequentially outputs those information charges to the output section 1*d*. The output section 1*d* includes an electrically isolated capacitor which receives the information charges from the horizontal transfer section 1*h* pixel by pixel, and an amplifier which produces a voltage value signal or a image signal Y0(t) in accordance with a potential change in the capacitor.

The clock generator 2 includes a vertical clock generating section 2*v*, a storage clock generating section 2*s*, a horizontal clock generating section 2*h* and a substrate clock generating section 2*b*. The vertical clock generating section 2*v* supplies a vertical clock $\phi$v synchronous with a vertical sync signal VD to the light-receiving section 1*i*. In response to the vertical clock $\phi$v, the light-receiving section 1*i* promptly transfers the information charge packets to the storage section 1*s* in the blanking period for vertical scanning. The storage clock generating section 2*s* supplies a storage clock $\phi$s synchronous with a horizontal sync signal HD to the storage section 1*s*. In response to the storage clock $\phi$s, the storage section 1*s* receives the information charge packets transferred from the light-receiving section 1*i* and transfers one screen of information charge packets received to the horizontal transfer section 1*h* row by row in the blanking period for horizontal scanning.

Figure 6:
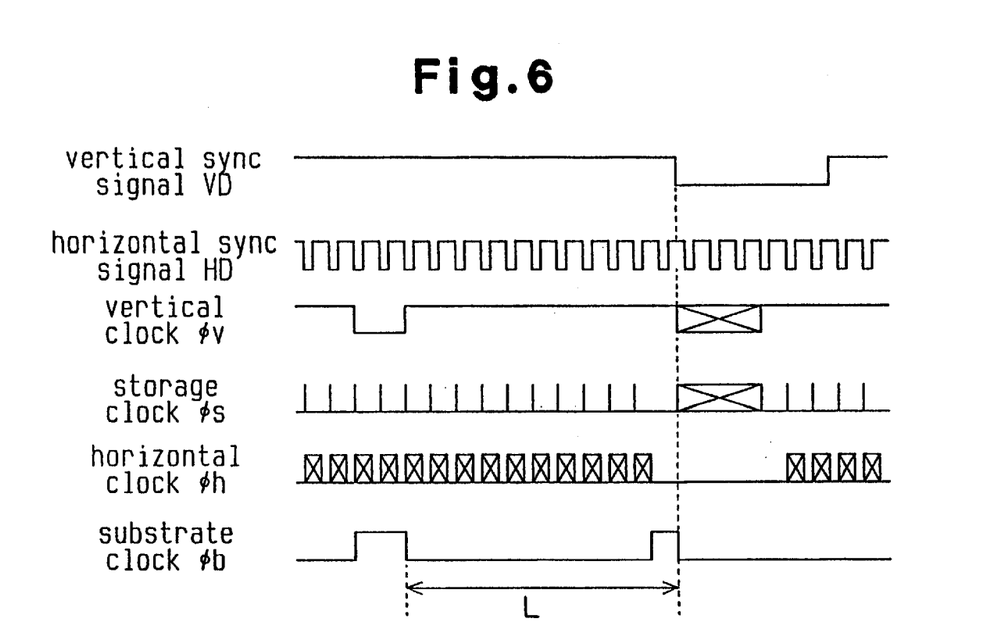
FIG. 6 is a timing chart for explaining the operation of the image sensing apparatus embodying the invention.

The horizontal clock generating section 2*h* supplies a horizontal clock $\phi$h synchronous with the horizontal sync signal HD to the horizontal transfer section 1*h*. In response to the horizontal clock $\phi$h, the horizontal transfer section 1*h* receives one row of information charge packets transferred from the storage section 1*s* and sequentially transfers those information charge packets to the output section 1*d*. The horizontal clock generating section 2*h* also supplies a reset clock $\phi$r (not shown) synchronous with the horizontal clock $\phi$h to the output section 1*d*. In response to the reset clock $\phi$r, the output section 1*d* discharges the information charge packets from the capacitor. The substrate clock generating section 2*b* supplies a substrate clock $\phi$b to a drain region (which will be discussed later) in the light-receiving section 1*i*. The substrate clock $\phi$b rises (i.e., is high) for a predetermined period during the vertical scan period. This substrate clock $\phi$b is supplied to the light-receiving section 1*i* to discharge the information charges stored in the light-receiving section 1*i*. As shown in FIG. 6, therefore, the information-charge storing time of the light-receiving section 1*i* is indicated by a period L from the point of completion of the discharging of the information charges by the substrate clock $\phi$b to the beginning of the transfer of the information charges by the vertical clock $\phi$v. Alteration of the supply timing for this substrate clock $\phi$b permits the information-charge storing period or the shutter speed to be controlled.

The timing controller 3 shown in FIG. 4 generates a vertical timing signal VT synchronous with the vertical scanning in response to the vertical sync signal VD, and supplies the vertical timing signal VT to the vertical clock generating section 2*v*. The timing controller 3 generates a storage timing signal ST synchronous with the vertical scanning and horizontal scanning in response to the vertical sync signal VD and horizontal sync signal HD, and supplies the storage timing signal ST to the storage clock generating section 2*s*. The timing controller 3 further generates a horizontal timing signal HT synchronous with the horizontal scanning in response to the horizontal sync signal HD, and supplies the horizontal timing signal HT to the horizontal clock generating section 2*h*.

Based on exposure information supplied from the digital signal processor 6 which will be discussed later, the timing controller 3 produces a discharge timing signal BT and supplies the discharge timing signal BT to the substrate clock generating section 2*b*. Based on the exposure information indicative of the over-exposure of the CCD solid state image sensor 1, the timing controller 3 outputs the discharge timing signal BT so as to delay the supply timing for the substrate clock $\phi$b, thereby shortening the information-charge storing period L. Based on the exposure information indicative of insufficient exposure, on the other hand, the timing controller 3 outputs the discharge timing signal BT so as to quicken the supply timing for the substrate clock $\phi$b, thereby elongating the information-charge storing period L. This feedback control allows the CCD solid state image sensor 1 to maintain the proper exposure state.

The analog signal processor 4 receives the image signal Y0(t) from the CCD solid state image sensor 1 and performs signal processing such as sample-and-hold processing and AGC (Automatic Gain Control) processing to produce a processed image signal Y1(t) in a predetermined format. In the sample-and-hold processing, for example, only the difference between the discharge level and the signal level is acquired from the image signal Y0(t) which has the discharge level and signal level alternately repeated at given periods. In the AGC processing, the gain of the image signal Y0(t) is adjusted so that the average level of the image signal Y1(t) over one screen falls within the proper range. The A/D converter 5 converts the image signal Y1(t) output from the analog signal processor 4 to a digital image signal D1(n) in synchronism with the output operation of the CCD solid state image sensor 1. The digital signal processor 6 receives the digital image signal D1(n) from the A/D converter 5 and performs outline compensation and generation of exposure information to produce an image data signal D2(n). When color image sensing is carried out, processes such as white balance control and filtering are performed to produce the image data signal D2(n). The image data signal D2(n) is transferred to the display apparatus after being converted to an analog image signal by a D/A converter (not shown), or it is directly recorded on a recording medium by a recording apparatus (not shown).

The feature of this invention lies in that as shown in FIG. 6, at the end of the information-charge storing period L, the substrate clock $\phi$b is temporarily caused to rise to restrict the amount of information charges to be stored in the channel regions (which will be discussed later) of the light-receiving section 1*i*. Then, the information charges are transferred to the storage section is from the light-receiving section 1$i$ in response to the vertical clock φv. In other words, the substrate clock φb is temporarily caused to rise with the vertical clock φv fixed to the high level during the information-charge storing period L. As a result, the potential barrier between the channel regions in the light-receiving section 1$i$ and the semiconductor substrate (an excess-charge absorbing drain region) becomes lower, thus restricting the information-charge storing performance of the channel regions. Thereafter, the substrate clock φb is caused to fall and the information charges stored in the light-receiving section 1$i$ are transferred to the storage section 1$s$ in response to the vertical clock φv and the storage clock φs.

Figure 5:
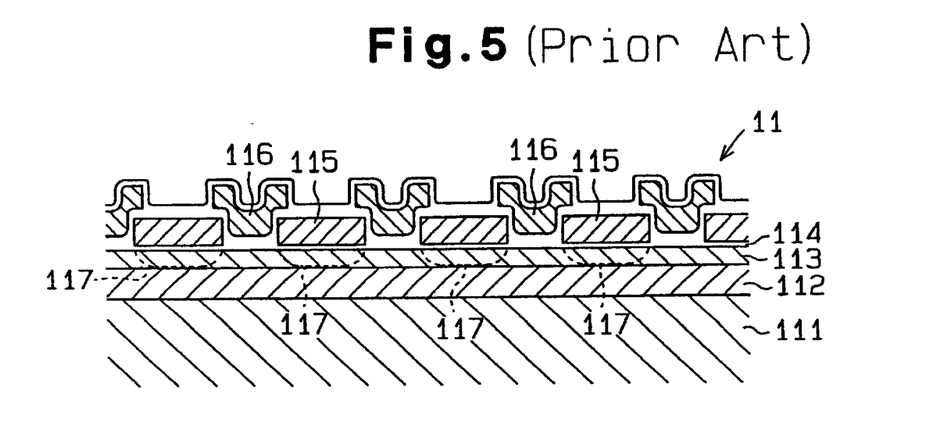
FIG. 5 is a cross-sectional view illustrating a light-receiving section of a solid state image sensor having the vertical overflow drain structure according to one embodiment of the invention.

FIG. 5 is a cross-sectional view of the light-receiving section 1$i$ of the CCD solid state image sensor 1 having the vertical overflow drain structure. The light-receiving section 1$i$ has a semiconductor substrate 111 which has an N type conductivity and where the drain region is to be formed. Formed on the surface of the semiconductor substrate 111 is a diffusion region (P-well region) 112 having a P type conductivity. The drain region in the semiconductor substrate 111 absorbs the charges which overflow in the light-receiving section 1$i$. Formed on the surface of this P-well region 112 is a diffusion layer (buried layer) 113 which has an N type conductivity and where channel regions 117 are formed. The buried layer 113 is formed so as to be defined by an isolation region (not shown) on the surface of the P-well region 112 and to extend in one direction. First gate electrodes 115 are arranged at given intervals on the buried layer 113 via an insulating layer 114, and second gate electrodes 116 are arranged between the adjoining first gate electrodes 115 in such a way as to partially cover the individual first gate electrodes 115. The first and second gate electrodes 115 and 116 are respectively supplied with four-phase vertical clocks φv, each of which has a phase difference of 90 degrees from one to another, and the semiconductor substrate 111 is supplied with the substrate clock φb. A ground voltage is applied to the P-well region 112.

Figure 7:
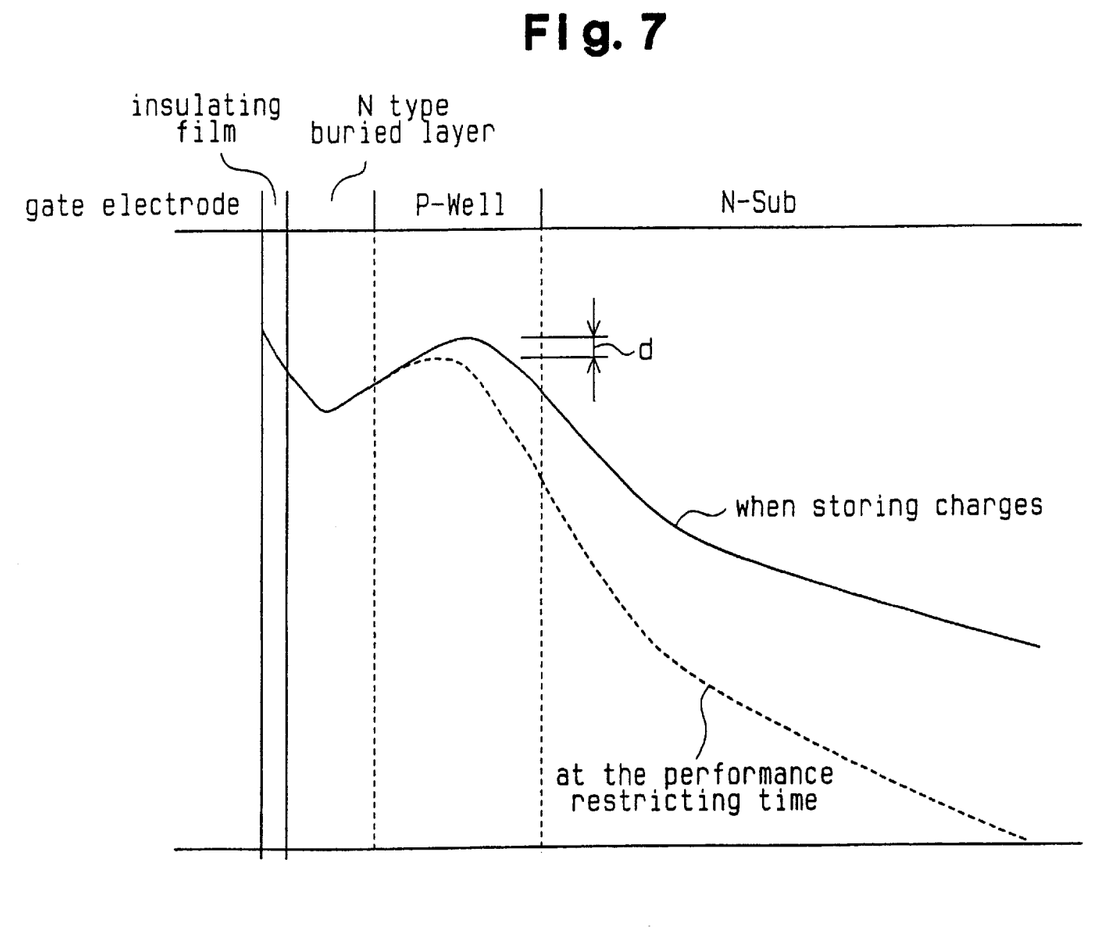
FIG. 7 is a diagram showing a potential change in the solid state image sensor having the vertical overflow drain structure according to another embodiment of the invention shown in FIG. 5 at the time of storing charges and at the time of restricting the charging performance.

With this vertical overflow drain structure, when the light-receiving section 1$i$ stores information charges, the substrate clock φb is held at the low level, and one, two or three of the four-phase vertical clocks φv are kept at the high level (first control voltage) and the remaining of clocks is kept at the low level. As a result, the first and second gate electrodes 115 and 116 are selectively enabled. In a part of the light-receiving section 1$i$ where the first and second gate electrodes 115 and 116 are enabled, as shown in FIG. 7, a potential well is formed in each channel region 117 in the buried layer 113 and a potential barrier having a predetermined height is formed in the P-well region 112 between each channel region 117 and the drain region (semiconductor substrate 111).

At this time, the information-charge storing performance of the channel regions 117 is determined by the difference between the deepest potential level in the buried layer 113 and the shallowest potential level in the P-well region 112. This difference is so set that the channel regions 117 have a sufficient performance to store information charges.

According to this embodiment, the substrate clock φb is temporarily set high (second control voltage) to restrict the charge storing performance in the storing period. Consequently, the potential level of the semiconductor substrate 111 becomes deeper and the potential level in the P-well region 112 becomes slightly deeper (i.e., the potential barrier becomes lower) due to the influence of the substrate clock φb, as indicated by the broken line in FIG. 7. The potential level in the buried layer 113 close to the first gate electrodes 115 hardly changes, unaffected by the substrate clock φb. Therefore, the information-charge storing performance of the channel regions 117 at the time of restricting the charging performance becomes lower by the difference d between the height of the previously formed potential barrier and the height of the low potential barrier which has been formed at the charging-performance restricting time. Consequently, the information charges whose quantity exceeds the restricted charge storing performance move to the substrate 111 (drain region) from the buried layer 113 along the potential profile and are discharged therefrom. Subsequently, the substrate clock φb is set low (third control voltage), so that the potential of the substrate 111 and the potential in the P-well region 112 are restored (i.e., the height of the potential barrier returns to the predetermined height). Then, the vertical clock φv is supplied to the first and second gate electrodes 115 and 116 to transfer the information charge packets to the adjoining channel regions 117. Because the amount of the information charges stored in the channel regions 117 has been limited at this time, the amount of the information charges remaining in each channel region 117 is reduced as much as possible.

The height of the potential barrier at the charging-performance restricting time can be set by the potential of the semiconductor substrate 111 (peak-to-peak value of the substrate clock φb) or the profile of the impurities in the P-well region 112, the buried layer 113 and the semiconductor substrate 111. That is, at the charging-performance restricting time, the height of the potential barrier is set in such a way that a relatively small amount of information charges remain in the channel regions 117 by reducing the charge storing performance of the channel regions 117. This setting can surely lessen those information charges remaining untransferred at the time of transferring the information charges. When the height of the potential barrier is set by the potential of the substrate 111, the peak-to-peak value of the substrate clock φb should take three values. In this respect, it is preferable that the height of the potential barrier be set by the profile of the impurities in the P-well region 112, the buried layer 113 and the substrate 111 instead of the potential of the substrate 111.

According to this embodiment of the present invention, as specifically described above, the substantial charge storing performance of the channel regions 117 of the CCD solid state image sensor 1 becomes the same as or lower than the transfer performance. Most of the information charges stored in a channel region 117 for a predetermined period L are transferred to the adjoining channel regions 117 in the buried layer 113. Consequently, even when bright spot light from a part of the target object is incident on the CCD solid state image sensor 1, the degradation of the quality of the reproduced image is prevented. The height of the potential barrier or the charge storing performance of the channel regions 117 is controlled by profile of the impurities in the P-well region 112, the buried layer 113 and the substrate 111. Hence, there is no need to change the circuit structure of the clock generator 2 which supplies various kinds of clocks. It is therefore possible to provide an image sensing apparatus which significantly reduces the information charges remaining as much as possible in the channel regions 117 by altering only the drive timing while retaining the conventional circuit structure.

The foregoing description of this embodiment has been given with reference to the CCD solid state image sensor 1 having the vertical overflow drain structure. This invention may also be adapted to a CCD solid state image sensor which has a lateral overflow drain structure in place of the vertical overflow drain structure. With the lateral overflow drain structure, excess information charges are absorbed in the drain region provided in the isolation region adjacent to each channel region.

Figure 8:
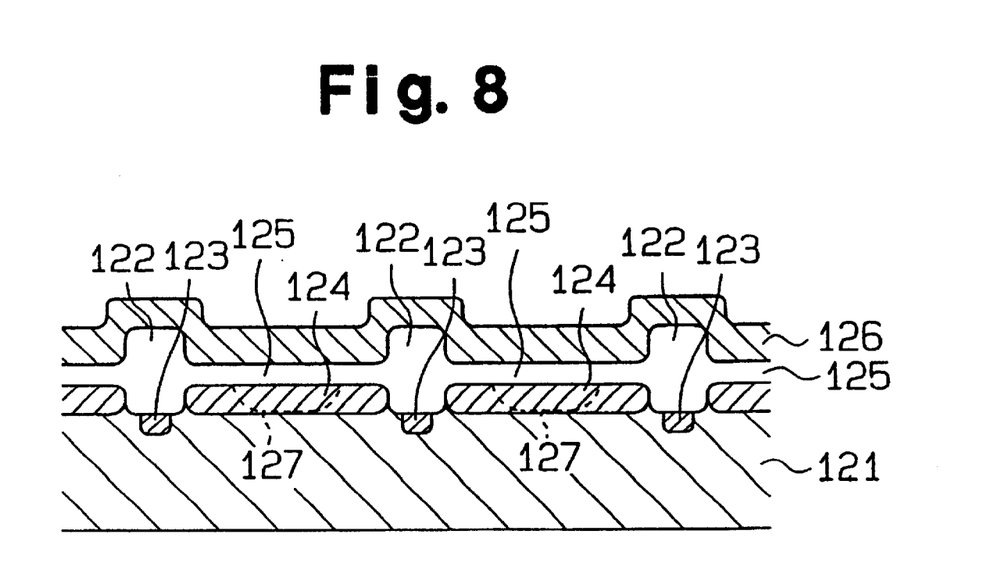
FIG. 8 is a cross-sectional view illustrating a light-receiving section of a solid state image sensor having a lateral overflow drain structure according to another embodiment of the invention.

FIG. 8 is a cross-sectional view of the light-receiving section 1$i$ of the CCD solid state image sensor 1 having a lateral overflow drain structure. The light-receiving section 1$i$ has a semiconductor substrate 121 having a P type conductivity. A plurality of channel isolation regions 122, each comprised of a relatively thick oxide layer formed by selective thermal oxidization, are formed at given intervals on the surface region of the semiconductor substrate 121. Overflow drain (OFD) regions 123 doped with a high-density N type impurity are defined under the channel isolation regions 122 and on the semiconductor substrate 121. Those channel isolation regions 122 and OFD regions 123 extend on the surface of the semiconductor substrate 121 in the direction penetrating the sheet of the drawing. Buried layers 124 having an N type conductivity, which are to serve as transfer channels 127, are formed on the semiconductor substrate 121 between the adjoining channel isolation regions 122. An insulating layer 125 is formed on the semiconductor substrate 121 so as to cover the buried layers 124. Gate electrodes 126 are formed on the channel isolation regions 122 and the insulating layer 125. The gate electrodes 126, like the first and second gate electrodes 115 and 116 shown in FIG. 5, have a double-layer structure. The vertical clock $\phi$v is supplied to the gate electrodes 126, and the substrate clock $\phi$b to the OFD regions 123. The ground voltage is normally applied to the semiconductor substrate 121. The peak-to-peak values of the vertical clock $\phi$v and the substrate clock $\phi$b, i.e., the applied voltages to the gate electrodes 126 and the OFD regions 123, are set according to the potential of the semiconductor substrate 121 taken as a reference.

At the time information charges are stored, the substrate clock $\phi$b is held at the low level, and the vertical clock $\phi$v is held at the high level. As a result, a potential well is formed in each transfer channel 127 (the buried layer 124) and a potential barrier is formed in each channel isolation region 122 between the transfer channel 127 and the associated OFD region 123. A deep well is formed in the OFD region 123. At this time, the information-charge storing performance of the transfer channel 127 is determined by the difference between the deepest potential level in the transfer channel 127 and the shallowest potential level in the associated channel isolation region 122.

Figure 9:
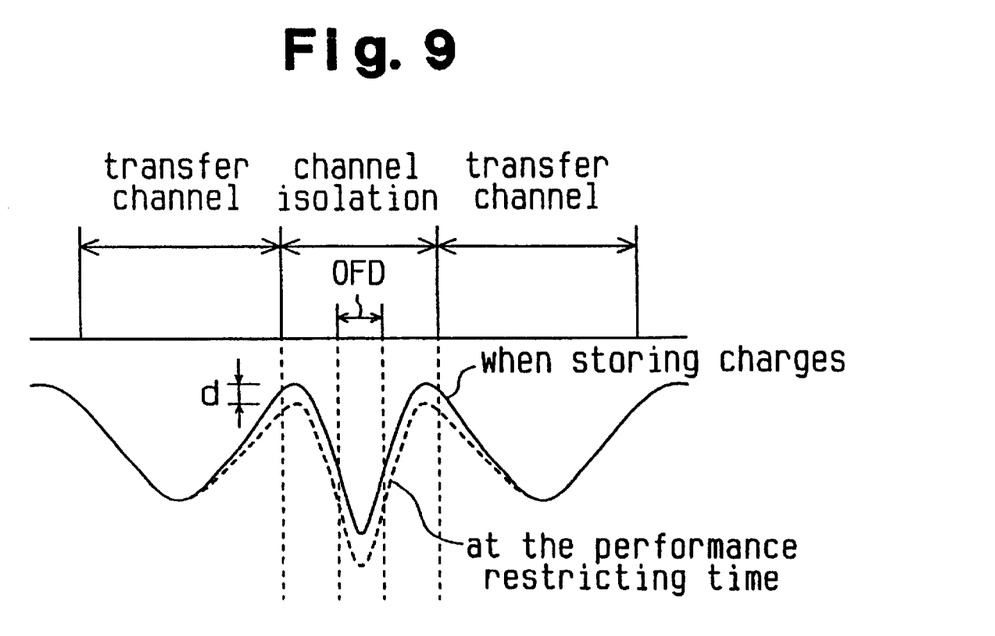
FIG. 9 is a diagram showing a potential change in the solid state image sensor having the lateral overflow drain structure according to another embodiment of the invention shown in FIG. 8 at the time of storing charges and at the time of restricting the charging performance.

When the substrate clock $\phi$b is temporarily set high to make the potential level in the OFD regions 123 deeper at the time of restricting the charge storing performance, the potential level of the channel isolation regions 122 becomes slightly deeper as indicated by the broken line in FIG. 9 due to the influence of the substrate clock $\phi$b. The potential in the transfer channels located apart from the OFD regions 123 hardly changes, unaffected by the substrate clock $\phi$b. At the time of restricting of the information-charge storing performance, therefore, the information-charge storing performance of the channel regions becomes lower by the difference d between the height of the previously formed potential barrier and the height of the potential barrier which has been formed at the charging-performance restricting time. Consequently, the information charge packets whose quantity exceeds the restricted charging performance are discharged to the substrate 121. At the next reading time, therefore, the amount of information charges remaining in the channel regions can be reduced as much as possible when the information charge packets are transferred to the adjoining channel regions.

The height of the potential barrier at the charging-performance restricting time can be set by the potential (the peak-to-peak value of the substrate clock $\phi$b) of the OFD regions 123 or the profile of the impurity in the transfer channels. In other words, at the charging-performance restricting time, the height of the potential barrier is set in such a way that a relatively small amount of information charges remain in the channel regions by reducing the transfer performance of the channel regions. This setting minimizes information charges from remaining untransferred at the time of transferring the information charge packets. When the height of the potential barrier is set by the potential of the OFD regions 123, the peak-to-peak value of the substrate clock $\phi$b should take three values. In this respect, it is preferable that the height of the potential barrier be set by the profile of the impurity in the buried layer 124.

Although the foregoing description of this invention has explained that this invention is adapted to a CCD solid state image sensor which is driven according to the frame transfer system, this invention may also be adapted to a line sensor in which a plurality of light-receiving pixels are associated with one row of shift registers. In this case, when information charges are transferred to the individual bits of the shift registers from the light-receiving pixels, the voltages to be applied to the drain regions provided adjacent to the shift registers are temporarily raised.

Although only two embodiments of the present invention have been described in detail herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope of the appended claims.

What is claimed is:

1. A method for driving a solid state image sensor having a semiconductor substrate and at least one layer which is located over said semiconductor substrate and where a plurality of channel regions are to be formed, a plurality of gate electrodes formed over said semiconductor substrate to respectively cover said channel regions, a plurality of drain regions being defined in said semiconductor substrate respectively adjacent to said plurality of channel regions in either a lateral direction or a vertical direction, each channel region being capable of storing information charges generated in the semiconductor substrate by the incident light from the side where the gate electrodes are formed, a potential barrier having a preset height being formed between one of said plurality of channel regions and an associated one of said plurality of drain regions when storing the information charges, said method comprising the steps of:

causing the potential barrier to disappear in order to drain the information charges stored in each channel region;

forming a potential well in at least one of said plurality of channel regions;

forming the potential barrier;

storing information charges, produced in said one of said plurality of channel regions, in said potential well in a predetermined period;

deforming said potential barrier to set said potential barrier lower than said preset height in said predetermined period in order to temporarily lower an information-charge storing performance in said potential well, thereby restricting the amount of said information charges stored in said potential well equal to or smaller than said lowered information-charge storing performance;

reforming said potential barrier so as to have substantially the same height as said preset height; and transferring packets of said information charges stored in said potential well to adjoining channel regions after said predetermined period elapses, wherein said deforming of said potential barrier step deforms said potential barrier to be lower than said preset height immediately before said transferring step.

2. The method according to claim 1, wherein each of said forming said potential well step and said forming said potential barrier step includes a step of controlling a first control voltage to be applied to one of said plurality of gate electrodes; and wherein said deforming of said potential barrier step includes a step of controlling a second control voltage to be applied to said semiconductor substrate defining said drain regions.

3. A driving device for a solid state image sensor adapted to an image sensing apparatus, said solid state image sensor having a semiconductor substrate, at least one layer which is located over said semiconductor substrate and where a plurality of channel regions are to be formed, and a plurality of gate electrodes formed over said semiconductor substrate to respectively cover said channel regions, a plurality of drain regions being defined in said semiconductor substrate respectively adjacent to said plurality of channel regions, each channel region being capable of storing information charges generated in the semiconductor substrate by the incident light from the side where the gate electrodes are formed, said driving device comprising:

a first control voltage generator for applying a first control voltage to one of said plurality of gate electrodes in a predetermined period to form a potential well in at least one of said plurality of channel regions, and to form a potential barrier having a preset height between said one of said plurality of channel regions and an associated one of said plurality of drain regions, whereby information charges produced in said one of said plurality of channel regions are stored in said potential well; and a second control voltage generator for applying a second control voltage to said semiconductor substrate defining said drain regions in said predetermined period so as to set said potential barrier lower than said preset height in order to temporarily lower an information-charge storing performance in said potential well, thereby restricting the amount of said information charges stored in said potential well equal to or smaller than said lowered information-charge storing performance, wherein said second control voltage generator applies a third control voltage to said semiconductor substrate following application of said second control voltage so that said potential barrier having a substantially same height as said preset height is reformed, wherein said second control voltage generator applies said second control voltage to said semiconductor substrate immediately before said predetermined period ends, and wherein before storing next information charges by applying first to third control voltages, said first and second control voltage generators apply fourth and fifth control voltages to the gate electrodes and the semiconductor substrate, respectively, to cause the potential barrier to disappear in order to drain the information charges stored in said potential well.

4. The apparatus according to claim 3, wherein said first control voltage generator applies a fourth control voltage to one of said plurality of gate electrodes after said predetermined period elapses so as to transfer said information charges stored in said potential well to adjoining channel regions.

5. A method for driving a solid state image sensor having a semiconductor substrate and at least one layer which is located over said semiconductor substrate and where a plurality of channel regions are to be formed, a plurality of gate electrodes formed over said semiconductor substrate to respectively cover said channel regions, a plurality of drain regions being defined in said semiconductor substrate respectively adjacent to said plurality of channel regions in either a lateral direction or a vertical direction, each channel region being capable of storing photoelectron charges, said method comprising the steps of:

forming a potential well behind a potential barrier in at least one of said plurality of channel regions;

discharging photoelectron charges in the potential well by enabling the drain region and deactivating the gate electrode;

storing photoelectron charges in the potential well by disabling a corresponding drain region and activating a corresponding gate electrode;

limiting photoelectron charge storage capacity of the potential well to an amount that can be transported by adjoining channel regions by enabling the corresponding drain region and activating the corresponding gate electrode; and, reforming the potential barrier;

transferring packets of the photoelectrons stored in the potential well to adjoining channel regions, wherein said limiting step deforms said potential barrier to be lower than a preset height immediately before said transferring step.

6. A method for driving a solid state image sensor, the image sensor including a potential well formed behind a potential barrier for storing information charges, the method comprising the steps of:

causing said potential barrier to disappear in order to drain the information charges stored in said potential well;

forming said potential barrier and said potential well to have a first information charge storage capacity;

storing information charges in the potential well;

deforming said potential barrier to a preset height to restrict the number of information charges stored in said well to a second information charge storage capacity, wherein said second information charge storage capacity is significantly less than said first information charge storage capacity;

reforming said potential barrier; and transferring said information charges to adjoining channel regions.

* * * * *